United States Patent [19]
Freeman et al.

[11] Patent Number: 5,925,187
[45] Date of Patent: Jul. 20, 1999

[54] APPARATUS FOR DISPENSING FLOWABLE MATERIAL

[75] Inventors: Gary T. Freeman, Beverly; Daniel Braunstein, Somerville, both of Mass.

[73] Assignees: Speedline Technologies, Inc., Franklin, Mass.; Massachusetts Institute of Technology, Cambridge, Mass.

[21] Appl. No.: 08/598,288

[22] Filed: Feb. 8, 1996

[51] Int. Cl.[6] .................................................. B05C 5/00
[52] U.S. Cl. .......................... 118/667; 118/712; 118/213; 118/301; 118/406; 101/120; 101/123; 101/129
[58] Field of Search .................................. 118/667, 712, 118/213, 301, 406, 323; 101/120, 123, 129

[56] References Cited

U.S. PATENT DOCUMENTS

| 2,571,064 | 10/1951 | Schaefer | 101/120 |
|---|---|---|---|
| 3,037,457 | 6/1962 | Sternlicht | 103/84 |
| 3,097,554 | 7/1963 | Rice et al. | 82/59 |
| 3,804,011 | 4/1974 | Zimmer | 101/120 |
| 3,921,520 | 11/1975 | Zimmer | 101/120 |
| 3,921,521 | 11/1975 | Kudlich | 101/120 |
| 3,965,817 | 6/1976 | Ipek | 101/120 |
| 4,023,486 | 5/1977 | Linthicum et al. | 101/120 |
| 4,043,683 | 8/1977 | Costa et al. | 401/264 |
| 4,075,089 | 2/1978 | Saari et al. | 209/169 |
| 4,485,736 | 12/1984 | Strutz, Jr. et al. | 101/129 |
| 4,622,239 | 11/1986 | Schoenthaler et al. | 427/96 |
| 4,636,406 | 1/1987 | Leicht | 427/96 |
| 4,715,278 | 12/1987 | Ericsson | 101/123 |
| 4,720,402 | 1/1988 | Wojcik | 427/282 |
| 4,961,955 | 10/1990 | Goldberg | 427/560 |
| 5,044,306 | 9/1991 | Erdmann | 118/120 |
| 5,050,496 | 9/1991 | Klemm | 101/123 |
| 5,151,132 | 9/1992 | Zimmer | 118/406 |
| 5,287,806 | 2/1994 | Nanzai | 101/123 |
| 5,309,837 | 5/1994 | Nanzai | 101/425 |
| 5,364,011 | 11/1994 | Baker et al. | 228/180.21 |
| 5,395,643 | 3/1995 | Brown et al. | 427/96 |
| 5,407,488 | 4/1995 | Ray | 134/6 |
| 5,454,655 | 10/1995 | Tani | 401/104 |
| 5,553,540 | 9/1996 | Tani | 101/129 |

FOREIGN PATENT DOCUMENTS

| 2279899 | 1/1995 | United Kingdom . |
|---|---|---|
| 2298393 | 9/1996 | United Kingdom . |
| WO96/20088 | 7/1996 | WIPO . |
| WO 98/16387 | 4/1998 | WIPO . |

OTHER PUBLICATIONS

*Freeman, G., "Screen Print Insurance", Circuits Manufacturing, Apr. 1989, pp. 27–31.

Primary Examiner—Laura Edwards
Attorney, Agent, or Firm—Mintz, Levin, Cohn, Ferris, Glovsky and Popeo, P.C.

[57] ABSTRACT

An apparatus for dispensing solder paste for application through a stencil or a screen to a circuit board includes a housing having an elongated chamber along a longitudinal axis and a rotatable member within the chamber. The housing has an inlet connected to a supply of solder paste and an elongated opening at the bottom of the chamber for delivering solder paste from the chamber. The rotatable member creates a pressure gradient within the chamber and causes delivery of the solder paste through the opening at controlled pressure. The rotatable member is spaced from an inner surface of the housing defining the chamber. The axis of rotation of the rotatable member is movable in two directions and the speed of rotation is adjustable. The forces on the rotating member are monitored in order to monitor solder conditions.

13 Claims, 3 Drawing Sheets

APPARATUS FOR DISPENSING FLOWABLE MATERIAL

BACKGROUND OF THE INVENTION

The invention relates to apparatus for dispensing flowable material, e.g., for dispensing solder paste for application through a stencil or screen to a substrate such as a circuit board.

Solder pads are often deposited in a desired pattern on a workpiece through a screen or a stencil. Typically a line of solder paste is manually dispensed from a tube onto the screen or stencil, and a squeegee blade is used to spread the solder paste across the stencil and cause it to fill up the holes in the screen or stencil. The solder paste tends to roll in front of the blade, which desirably causes mixing and shearing of the solder paste so as to attain desired viscosity to facilitate filling of the openings in the screen or stencil. The viscosity of the solder paste is also affected by its exposure to the atmosphere and by its temperature.

Fluid pressure affects the flow of material into stencil apertures. The fluid pressure of the solder paste is a function of the speed of the squeegee blade moving across the stencil surface and the angle that the squeegee blade makes with the stencil surface. The blade angle itself is dependent on the speed of the squeegee blade, and the downward preload (which can vary across the stencil surface) deflects the blade, also altering the fluid pressure. The fluid pressure of the solder paste is thus coupled to a number of dependent machine parameters.

SUMMARY OF THE INVENTION

In one aspect, the invention features, in general, apparatus for dispensing solder paste for application through a stencil or a screen to a circuit board. The apparatus includes a housing having an elongated chamber along a longitudinal axis and a rotatable member within the chamber. The housing has an inlet connected to a supply of solder paste and an elongated opening at the bottom of the chamber for delivering solder paste from the chamber. The rotatable member creates a pressure gradient within the chamber and causes delivery of the solder paste through the opening at controlled pressure.

In another aspect, the invention features, in general, apparatus for applying flowable material through a stencil or screen to a workpiece. The apparatus includes a table that supports the workpiece and a screen or stencil, a housing with an elongated chamber, a rotatable member within the chamber, and a housing displacer that is mounted on the table and moves the housing across the screen or stencil. The housing is connected to a supply of flowable material and has an elongated opening at the bottom of the chamber for delivering the flowable material from the chamber. Sealable surfaces on both sides of the elongated opening contact the screen or stencil. The rotatable member creates a pressure gradient within the chamber and causes delivery of the flowable material through the opening at controlled pressure and the displacer moves the housing across the screen or stencil.

In another aspect, the invention features, in general, apparatus for delivering flowable material at a controlled pressure that includes a housing having an inner surface defining an elongated chamber and a rotatable member that is mounted within the chamber. The housing has an elongated opening along the bottom of the chamber for delivering the flowable material. The rotatable member is mounted within the chamber and spaced from the inner surface so as to provide a flow path continuously around the cylinder. The cylinder is located with respect to the opening so as to deliver the flowable material at a desired pressure.

In another aspect, the invention features, in general, apparatus for delivering flowable material that includes a housing with an elongated chamber and a rotatable member within the chamber. The housing has an inlet connected to supply material to the chamber and an elongated opening at the bottom of the chamber to deliver material. There are supports that permit movement of the cylinder axis with respect to the longitudinal axis of the chamber in order to adjust the pressure of flowable material delivered at the opening.

In preferred embodiments, the rotatable member is spaced from an inner surface of the housing defining the chamber; the axis of rotation of the rotatable member is parallel to and offset with respect to the elongated opening; the axis of rotation of the rotatable member is movable in two directions (e.g., along an X, Y coordinate axis or according to radius, angle, coordinates); the speed of rotation is adjustable. The ratio of the radius of the cylinder to the radius of the chamber is preferably between 50% and 90%. The cylinder is preferably made of aluminum or other material exhibiting no-slip conditions with respect to the fluid being dispensed; the elongated opening is preferably greater than 0.01" and less than 0.125" in width. The speed of rotation of the cylinder surface is greater than the speed of the housing across the screen or stencil and is less than the speed at which Taylor vortices form. The force on the rotating member is monitored in order to monitor solder conditions. A temperature controller, for example, a Peltier device, is included to control the temperature of the solder paste.

In another aspect, the invention features, in general, a method for delivering flowable material at a controlled pressure including delivering material to a chamber, rotating a rotatable member located within the chamber, the rotatable member having a central axis of rotation positioned eccentrically with respect to a central axis of the chamber, determining properties of the material by measuring forces acting upon the rotatable member, and adjusting the rotation speed and eccentricity of the rotatable member to achieve desired properties.

In preferred embodiments, the chamber is moved across a stencil or screen to deposit material on a workpiece. The material exhibits viscoelastic properties.

Advantages of the invention include a decoupling of the fluid pressure of the solder paste from the speed of the printer's movement across the stencil.

Other advantages and features of the invention will be apparent from the following description of a preferred embodiment thereof and from the claims.

DESCRIPTION OF THE PREFERRED EMBODIMENTS

Figure 1:
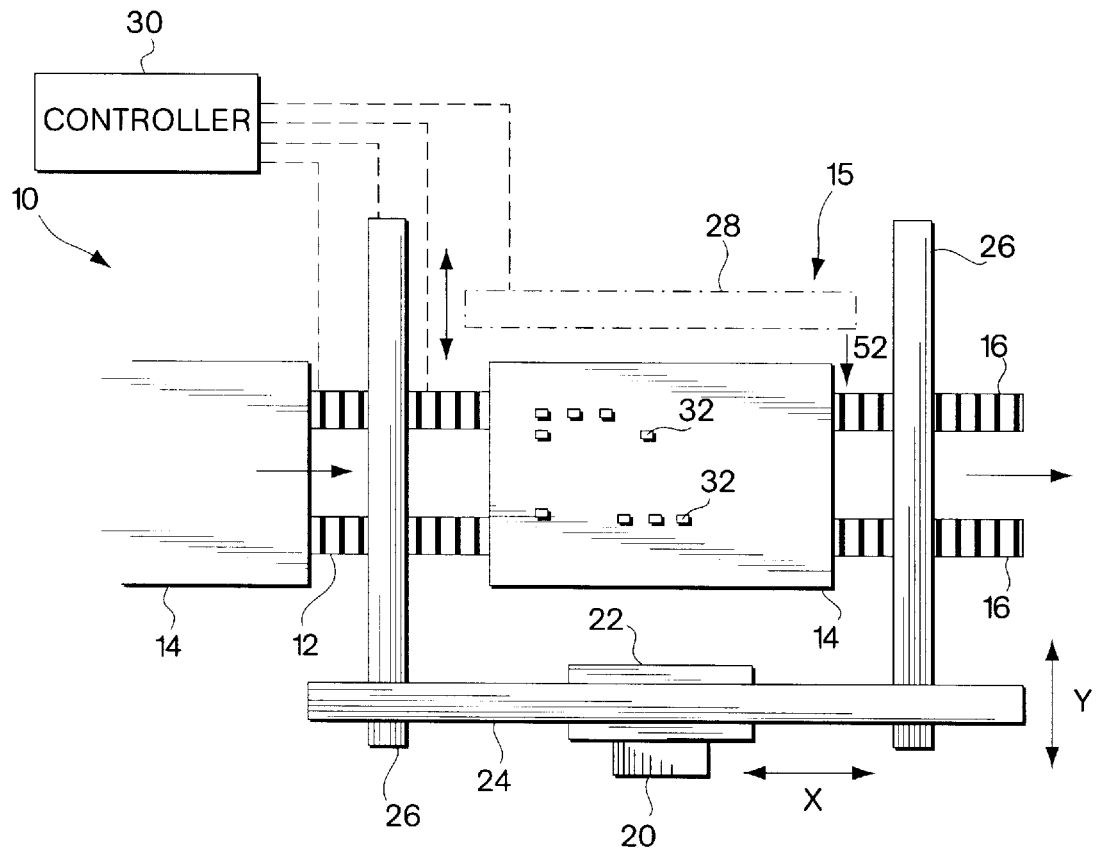
FIG. 1 is a plan view of a printer for depositing solder pads on a workpiece according to the invention.

Referring to FIG. 1, some of the components of printer 10 for applying deposits of solder paste on a substrate, e.g., printed circuit board (PCB) 14, are shown. The printer is an improvement of the type of printer described in Freeman U.S. Reissue Pat. No. 34,615 and commercially available under the Ultraprint 3000 trade designation from MPM Corporation, Franklin, Mass., both of which are hereby incorporated by reference. Printer 10 includes track feed mechanism 12 to supply the PCBs 14 to a central area 15 where the boards are supported from below (by components not shown). Track mechanism 16 is used to remove processed boards. The printer also includes camera 20 carried on carriage 22, which is movable in an X direction along rail 24, which is a linear X-axis of motion. Rail 24 in turn is movable in a Y direction along rails 26, which is a linear Y-axis of motion. Printer 10 also includes solder applicator 28 shown in phantom in FIG. 1.

Controller 30 receives inputs from and provides control signals to a wide variety of solder print control mechanisms on printer 10. These include the track mechanisms 12, 16 and solder applicator 28 shown on FIG. 1, other sensors and actuators not shown on FIG. 1, and movement of carriage 22 along rail 24 and of rail 24 along rails 26. Controller 30 indicates when a processed board 14 fails to meet user specified standards for printing solder, e.g., by providing alarm signals to an alarm and diverter signals to a board diverter (located down line of tractor mechanism 16).

During a production run, boards 14 are automatically moved into position by track feed mechanism 12, engaged by underboard support components (not shown) and raised into position directly under a stencil (not shown) with openings corresponding to the position for solder deposits 32. Solder applicator 28 then moves across the upper surface of the stencil, and solder paste is forced through the openings into contact with the surface of board 14. It is desired to have solder deposits completely fill the volume defined by the stencil openings.

Figure 2:
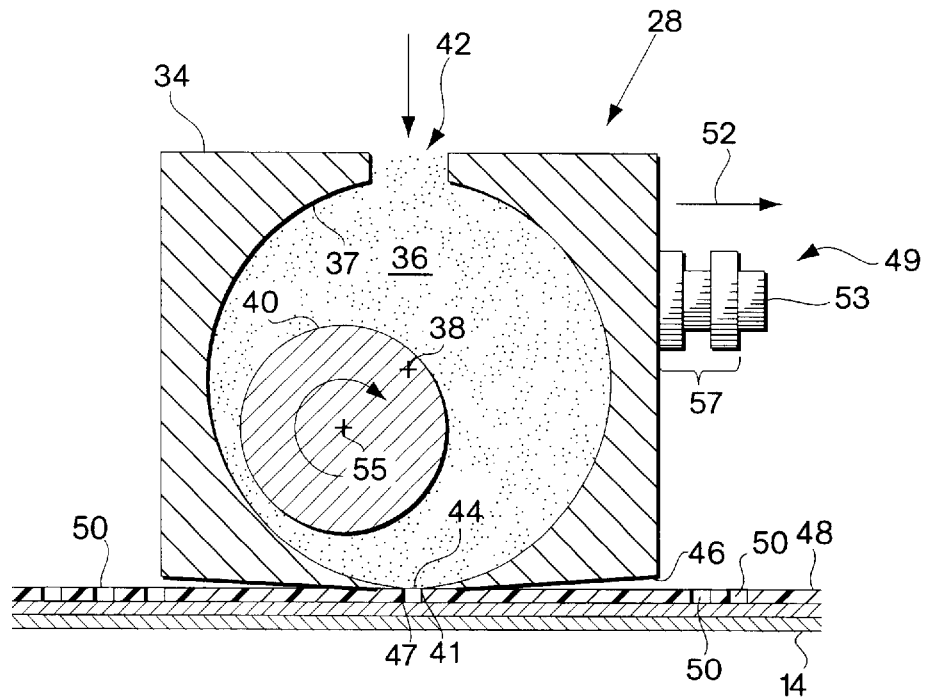
FIG. 2 is a sectional view showing a device for applying solder paste through a stencil to a circuit board in the FIG. 1 apparatus.

Referring to FIG. 2, solder applicator 28 is shown causing the solder paste to fill openings 50 in stencil 48 and to contact PCB 14 thereunder as the applicator 28 moves across PCB 14.

Solder applicator 28 includes housing 34 having elongated chamber 36 along longitudinal axis 38 (FIG. 3) and rotatable member 40 therein. Housing 34 has inlet 42 connected to supply solder paste to chamber 36, and elongated opening 44 at the bottom of the chamber for delivering solder paste from the chamber.

Housing 34 also has a lower surface 46 which tapers to a gasket 47 that makes sealable contact with the upper surface of stencil 48. Housing 34 is moved in the direction of arrow 52 and rotatable member 40 rotates about axis of rotation 55. Rotatably member 40 is preferably rotated in a clockwise direction which creates higher pressure over elongated opening 44 than rotation of member 40 in a counterclockwise direction.

Figure 3:
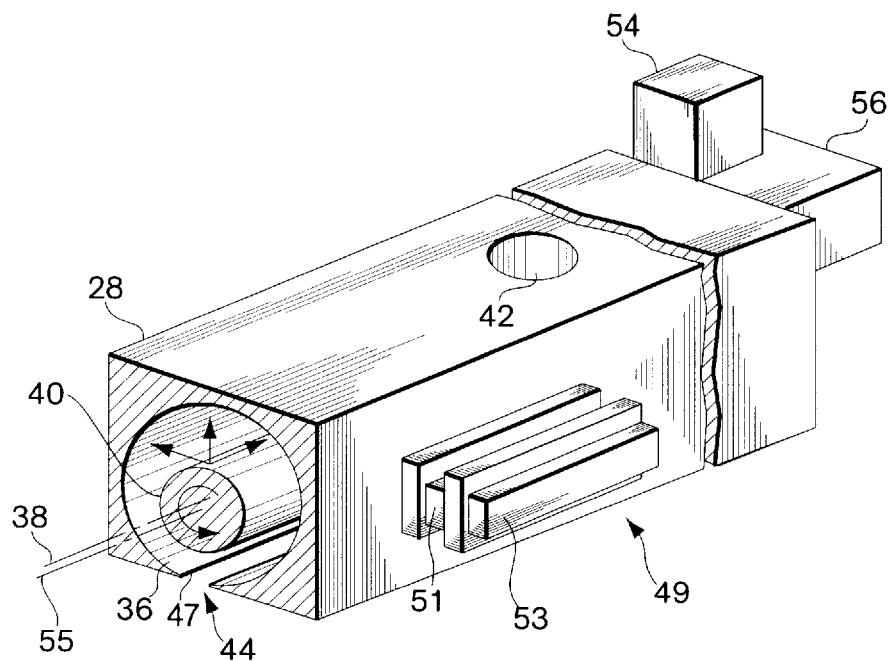
FIG. 3 is a diagrammatic perspective view of the FIG. 2 device.

The axis of rotation 55 of rotatable member 40 can be moved with respect to the longitudinal axis 38 of chamber 36 along a Cartesian coordinate system or a cylindrical coordinate system. Referring to FIG. 3, actuator 54 causes movement of the axis of rotation 55 of rotatable member 40 along the X, Y directions.

Solder applicator 28 also includes a temperature controller 49 for adjusting the temperature, and thus the viscosity, of the solder paste. Temperature controller 49 may be in the form of, for example, a Peltier device 51 which can control both heating and cooling and a heat sink 53. A temperature sensor, not shown, relays the temperature to controller 30 and controller 30 provides control signals to Peltier device 51 to adjust the temperature.

The surface finish of the outer surface of rotatable member 40 and the inner surface 37 of housing 34 are selected such that they exhibit no-slip conditions with respect to the fluid being dispensed, for example, the higher the viscosity of the fluid being dispensed, the rougher the surface finish selected to aid in adhesion of the material to the rotatable member. Rotatable member 40 is preferably made of anodized aluminum or stainless steel.

Figure 4:
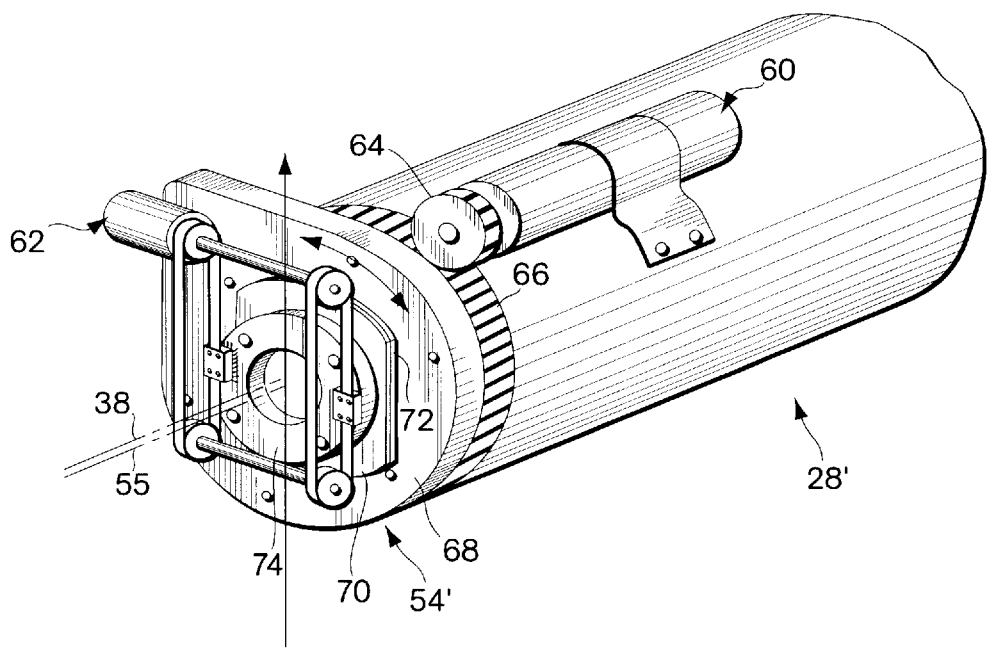
FIG. 4 is a diagrammatic perspective view of another embodiment of the FIG. 2 device.

Referring to FIG. 4, there is shown a solder applicator 28' which is similar to solder applicator 28. In this embodiment, the axis of rotation 55 of rotatable member 40 is movable along cylindrical coordinates. Actuator 54' moves rotatable member 40 (not shown in FIG. 4) with respect to the cylinder axis 38 in an angular direction via motor 60 and in a radial direction via motor 62. Gear 64 on motor 60 interacts with gear 66 on rotating face plate 68. Sliding plate 70 has a sliding seal 72 with respect to face plate 68 and is driven in a radial direction via motor 62 to move bearing block 74. Rotatable member 40 is rotatably mounted to bearing block 74 for movement therewith. Actuator 28' has an outer cylindrical profile and includes a slot 44 (not shown) with a gasket (as shown in FIG. 2) to provide a seal against the stencil.

Solder paste exhibits non-Newtonian, time dependent (thixotropic), viscoelastic behavior. The rotational speed of rotatable member 40 can be used to control the viscosity of the paste; the viscosity decreases with an increase in rotational speed (shear thinning). Shear thinning is often a desirable result for printing since it enhances the paste's ability to flow. The eccentricity of axis of rotation 55 of rotatable member 40 with respect to longitudinal axis 38 of chamber 36 can be used to control the fluid pressure of the paste. To produce a desired viscosity and a desired fluid pressure, the actuation of the rotational speed of rotatable member 40 and the positioning of axis of rotation 55 are done independently.

The pressure distribution within chamber 36 is also dictated by the viscoelastic properties of the material. The orientation of the eccentricity and the rotational speed of rotatable member 40 within chamber 36 for a non-linear material affect the apparent viscoelastic properties of the material. Hence, to acquire a particular pressure at a particular location both the amount of eccentricity and the orientation of the eccentricity of rotatable member 40 must be controlled. By providing two degrees of freedom, actuators 54, 54' provide control of both the amount of eccentricity and the orientation of the eccentricity.

Rotation of rotatable member 40 within chamber 36 filled with solder paste creates loads on member 40. These loads can be analyzed to determine the properties of the solder paste as they relate to solder flowability and pressure. The speed of rotation of rotatable member 40 and its eccentricity with respect to opening 40 can then be adjusted to control instantaneous properties and maintain a specified pressure distribution of the solder paste to optimize the solder flowability.

Figure 5:
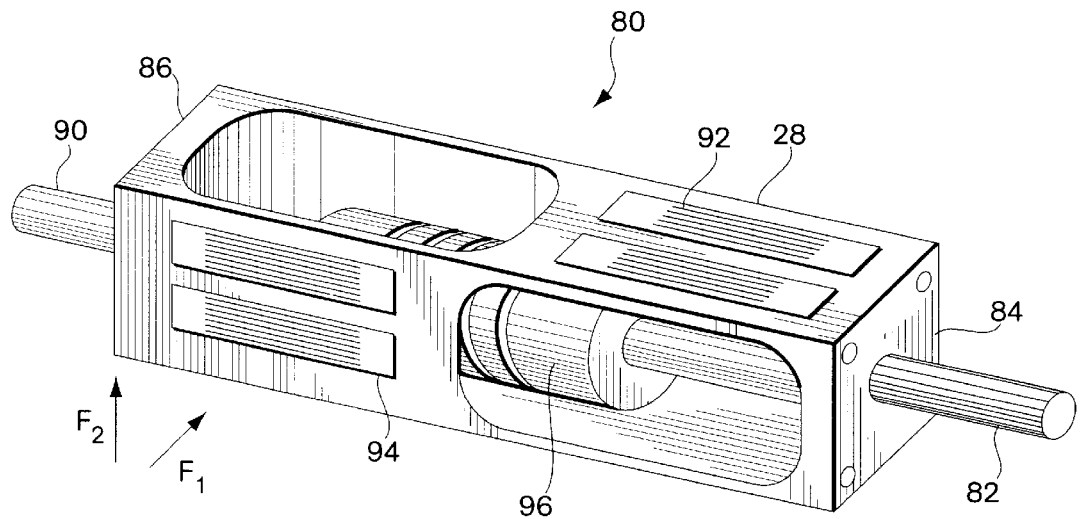
FIG. 5 is a perspective view of a technique for measuring the forces on a rotating shaft with stationary information in the FIG. 1 apparatus.

Referring to FIG. 5, a drive unit 56 (FIG. 3) causes rotation of rotatable member 40 and includes a force sensing unit 80 for sensing forces on the rotatable member in the X and Y directions via strain gauges. Drive unit 56 includes a rotating shaft 82 that passes through and is used to drive the rotating member 40. Shaft 82 is driven by a motor connected to end 90. A flexible shaft coupling 96 connects end 90 to shaft 82. Force sensing unit 80 is used to determine the forces on rotating shaft 82. Unit 80 has a fixed end 84 that is fixed with respect to housing 28 and a floating end 86. Strain gauges 92 on the top and bottom (bottom gauge is not shown on FIG. 5) and strain gauges 94 on the two sides (only one side being shown) measure bending from transverse forces F1 and F2 on shaft 82, as is well known in the art. The properties of the solder paste within chamber 40 affects the value of the forces F1 and F2.

Figure 6:
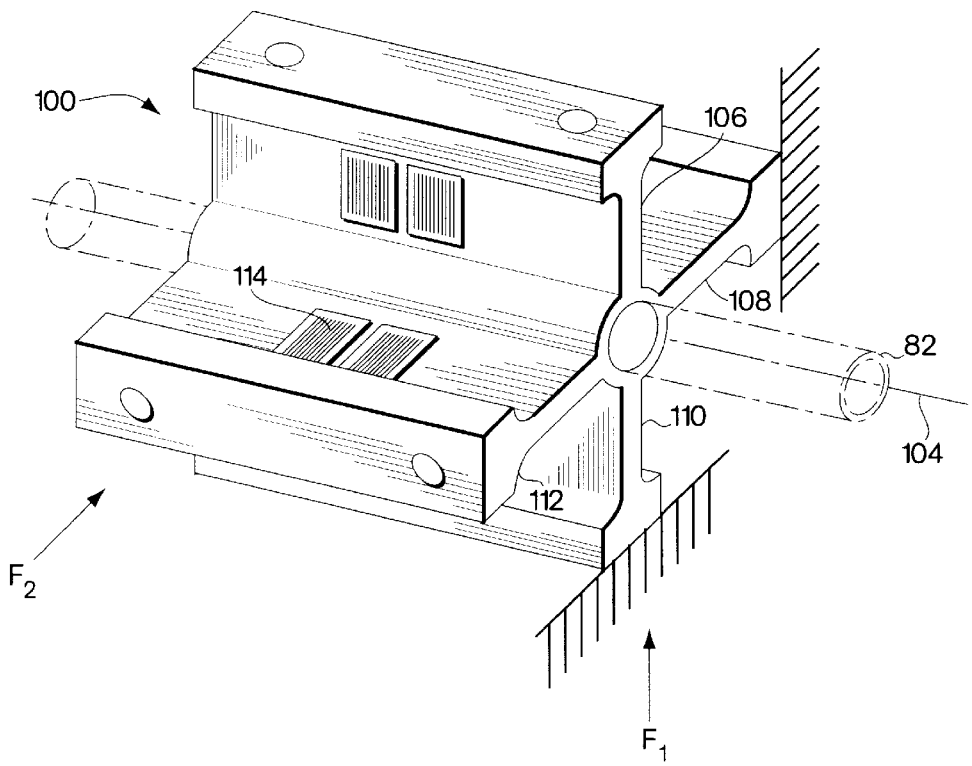
FIG. 6 is a perspective view of an alternative apparatus for measuring the forces on a shaft with stationary instrumentation.

Referring to FIG. 6, force sensing unit 100 employs a different structure to measure forces on a shaft using stationary instrumentation. Unit 100 has opening 102 along axis of rotation 104 for a driveshaft 82' used to drive rotatable member 40. Unit 100 has four flexural arms 106, 108, 110, 112 that each carry two or four strain gauges 114 thereon. The flexural arms are preloaded in uniaxial tension and forces F1 and F2 are measured by the reduction and increase of strain in the preloaded flexural arms. The measured forces F1 and F2 are equal to the forces on the rotatable member 40 within cylinder 36.

In operation, the speed of rotation of cylindrical member 40 and its eccentricity as well as the temperature of the solder paste can be adjusted in order to control the pressure and viscosity of the solder paste at opening 44 and thus control the application of solder paste through stencil 48. The units shown in FIGS. 5 and 6 sense the forces on rotatable member 40, which are a function of the viscosity and the pressure conditions within housing 34. To maintain a particular fluid pressure in the presence of shear thinning, the eccentricity of the rotatable member 40 with respect to the chamber is controlled to maintain the desired fluid pressure. For example, for an increase in measured force indicating thickening of the solder paste, the speed of rotation of rotatable member 40 is increased to thin the solder paste and the eccentricity of the member is decreased to maintain the pressure.

An advantage of solder applicator 28, is that the fluid pressure of the solder paste is decoupled from the speed of the applicator across the stencil surface. The desired speed of rotation of rotatable member 40 is generally greater than the speed of the movement of the applicator across the stencil surface but less than the speed at which Taylor vortices would form.

Housing 28 also desirably protects the paste from the environment and decreases adverse environmental affects such as solvent evaporation.

Other embodiments are within the scope of the following claims.

For example, printer 10 can be used to deposit adhesives such as epoxy, and the applicator can be used to dispense fluid materials under controlled conditions in other applications.

What is claimed is:

1. An apparatus for dispensing solder paste for application through a stencil or screen to a circuit board comprising:

a housing having an elongated chamber along a longitudinal axis, an inlet connected to supply solder paste to said chamber, an elongated opening at the bottom of said chamber aligned with said longitudinal axis for delivering solder paste from said chamber;

a rotatable member within said chamber for creating a pressure gradient within said chamber and causing delivery of solder paste through said opening at controlled pressure; and a temperature controller, coupled to the housing, for controlling the temperature of the solder paste;

wherein the housing has an inner surface defining the elongated chamber and the rotatable member is spaced from the inner surface, the rotatable member has a rotation axis that is parallel to and offset with respect to the elongated opening, and the rotation axis is movable with respect to the longitudinal axis of the housing in two directions defined by an X, Y coordinate axis.

2. The apparatus of claim 1 wherein said rotatable member has an adjustable speed of rotation.

3. The apparatus of claim 1 wherein said elongated chamber is substantially cylindrical.

4. The apparatus of claim 3 wherein said rotatable member is substantially cylindrical.

5. The apparatus of claim 4 wherein the ratio of the radius of the rotatable member to the radius of the elongated chamber is between 0.5 and 0.9.

6. The apparatus of claim 1 wherein the rotatable member is made of anodized aluminum.

7. The apparatus of claim 1 wherein said elongated opening is greater than 0.01" wide and less than 0.125" wide.

8. The apparatus of claim 1 wherein said housing is movable in a direction transverse to said elongated opening.

9. The apparatus of claim 8 wherein a desired speed of rotation of said rotatable member is greater than a speed of the movement of said housing.

10. The apparatus of claim 9 wherein said desired speed of rotation of said rotatable member is less than a speed of rotation at which Taylor vortices form.

11. The apparatus of claim 1 wherein said temperature controller is a Peltier device.

12. An apparatus for dispensing solder paste for application through a stencil or screen to a circuit board comprising:

a housing having an elongated chamber along a longitudinal axis, an inlet connected to supply solder paste to said chamber, an elongated opening at the bottom of said chamber aligned with said longitudinal axis for delivering solder paste from said chamber;

a rotatable member within said chamber for creating a pressure gradient within said chamber and causing delivery of solder paste through said opening at controlled pressure; and a temperature controller, coupled to the housing, for controlling the temperature of the solder paste;

wherein the housing has an inner surface defining the elongated chamber and the rotatable member is spaced from the inner surface, the rotatable member has a rotation axis that is parallel to and offset with respect to the elongated opening, and the rotation axis is movable with respect to the longitudinal axis of the housing in radial and angular directions.

13. An apparatus for dispensing solder paste for application through a stencil or screen to a circuit board comprising:

a housing having an elongated chamber along a longitudinal axis, an inlet connected to supply solder paste to said chamber, an elongated opening at the bottom of said chamber aligned with said longitudinal axis for delivering solder paste from said chamber;

a rotatable member within said chamber for creating a pressure gradient within said chamber and causing delivery of solder paste through said opening at controlled pressure;

a temperature controller, coupled to the housing, for controlling the temperature of the solder paste;

a force sensing unit for measuring forces on said rotating member to monitor solder conditions.

* * * * *